(12) United States Patent
Sakurai et al.

(10) Patent No.: US 8,211,783 B2
(45) Date of Patent: Jul. 3, 2012

(54) METHOD FOR MANUFACTURING SEMICONDUCTOR DEVICE INCLUDING A PATTERNED SIOC FILM AS A MASK

(75) Inventors: Noriko Sakurai, Kanagawa-ken (JP); Katsunori Yahashi, Mie-ken (JP); Tokuhisa Ohiwa, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/966,458

(22) Filed: Dec. 13, 2010

(65) Prior Publication Data
US 2011/0183497 A1     Jul. 28, 2011

(30) Foreign Application Priority Data

Jan. 25, 2010   (JP) .................................. 2010-013146
Oct. 1, 2010    (JP) .................................. 2010-224004

(51) Int. Cl.
*H01L 21/20*     (2006.01)
*H01L 21/36*     (2006.01)
*H01L 21/4763*   (2006.01)
*H01L 21/302*    (2006.01)
*H01L 21/461*    (2006.01)

(52) U.S. Cl. ......... 438/478; 438/622; 438/717; 438/791
(58) Field of Classification Search .................. 438/478, 438/622, 717, 791; 257/E23.145
See application file for complete search history.

(56) References Cited

U.S. PATENT DOCUMENTS

| | | | | |
|---|---|---|---|---|
| 6,399,286 | B1 * | 6/2002 | Liu et al. ........................ | 430/316 |
| 7,387,921 | B2 | 6/2008 | Yahashi et al. | |
| 2003/0027433 | A1 * | 2/2003 | Faur et al. ..................... | 438/770 |
| 2008/0014739 | A1 * | 1/2008 | Matz et al. ..................... | 438/622 |
| 2009/0283819 | A1 | 11/2009 | Ishikawa et al. | |

FOREIGN PATENT DOCUMENTS

| JP | 2007-266143 | | 10/2007 |
|---|---|---|---|
| WO | WO2009075370 | * | 6/2009 |

OTHER PUBLICATIONS

U.S. Appl. No. 12/718,641, filed Mar. 5, 2010, Yahashi.

* cited by examiner

*Primary Examiner* — William M. Brewster
(74) *Attorney, Agent, or Firm* — Oblon, Spivak, McClelland, Maier & Neustadt, L.L.P.

(57) ABSTRACT

According to one embodiment, a method is disclosed for manufacturing a semiconductor device. The method can include multiply stacking an insulating layer and a conductive layer alternately above a base member. The insulating layer includes silicon oxide. The conductive layer includes silicon. In addition, the method can form a SiOC film on a stacked body of the insulating layers and the conductive layers, pattern the SiOC film, and make a hole in the stacked body by etching the insulating layers and the conductive layers using the patterned SiOC film as a mask.

17 Claims, 5 Drawing Sheets

METHOD FOR MANUFACTURING SEMICONDUCTOR DEVICE INCLUDING A PATTERNED SIOC FILM AS A MASK

CROSS-REFERENCE TO RELATED APPLICATIONS

This application is based upon and claims the benefit of priority from Japanese Patent Application No. 2010-013146, filed on Jan. 25, 2010 and Japanese Patent Application No. 2010-224004, filed on Oct. 1, 2010; the entire contents of all of which are incorporated herein by reference.

FIELD

Embodiments described herein relate generally to a method for manufacturing a semiconductor device.

BACKGROUND

Memory device technology that three-dimensionally arranges memory cells has been discussed in, for example, JP-A 2007-266143. The memory device technology includes making memory holes in a stacked body in which a conductive layer, which functions as a control gate, and an insulating layer are multiply stacked alternately. A charge storage film is formed on the inner walls of the memory holes, and silicon is subsequently provided in the memory holes.

By repeating processes to alternately etch the conductive layers and the insulating layers, or collectively etching the conductive layers and the insulating layers at the same process, the memory holes are made in the stacked body thereof. Considering the productivity and the like during such etching, it is desirable to use an appropriate etching mask material which can be common to both the insulating layer and the conductive layer.

BRIEF DESCRIPTION OF THE DRAWINGS

FIG. 3A to FIG. 4B are schematic cross-sectional views illustrating a method for manufacturing the semiconductor device according to the embodiment.

DETAILED DESCRIPTION

According to one embodiment, a method is disclosed for manufacturing a semiconductor device. The method can include multiply stacking an insulating layer and a conductive layer alternately above a base member. The insulating layer includes silicon oxide. The conductive layer includes silicon. In addition, the method can form a SiOC film on a stacked body of the insulating layers and the conductive layers, pattern the SiOC film, and make a hole in the stacked body by etching the insulating layers and the conductive layers using the patterned SiOC film as a mask.

Exemplary embodiments will now be described with reference to the drawings.

Figure 1:
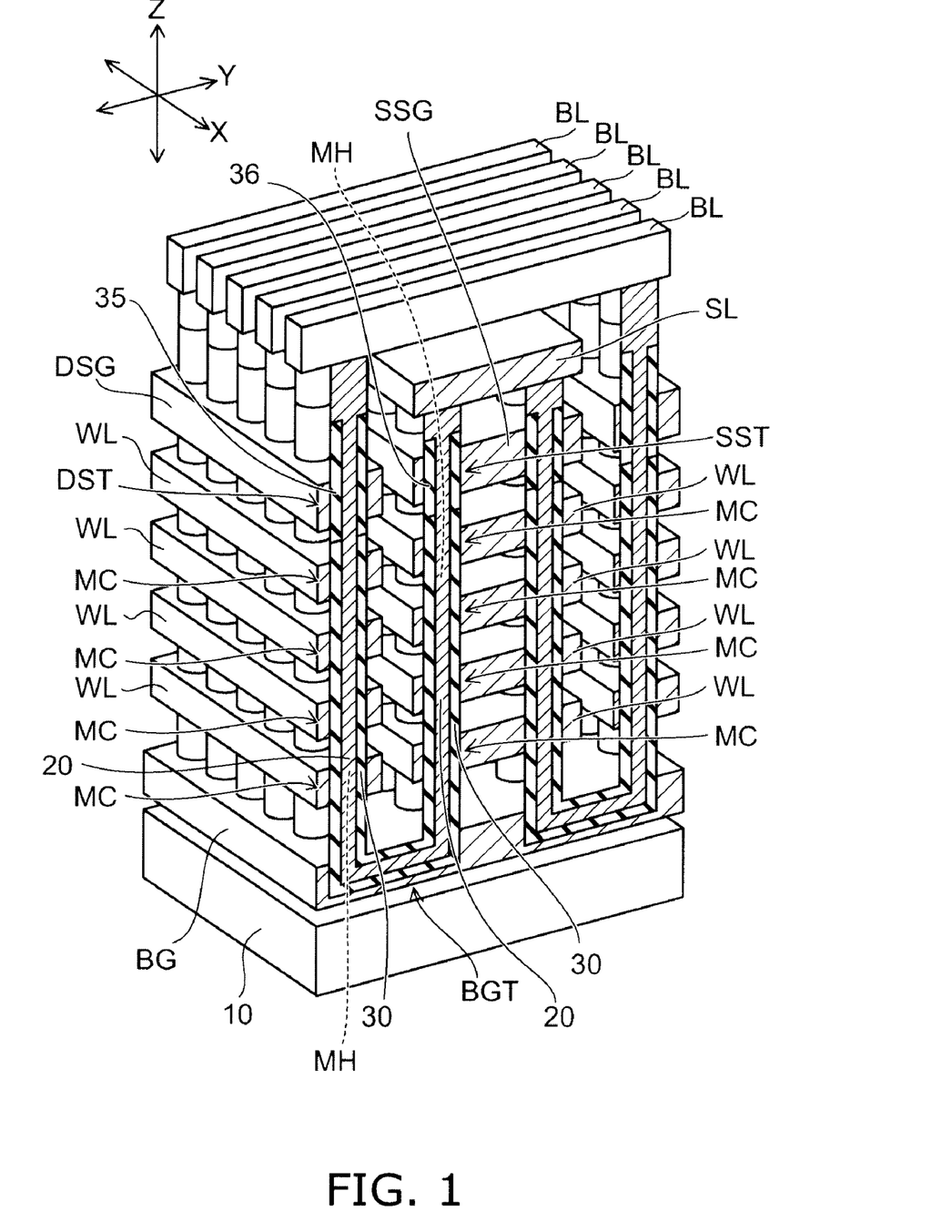
FIG. 1 is a schematic perspective view of a semiconductor device according to an embodiment.

FIG. 1 illustrates the configuration of a memory cell array of a semiconductor device according to this embodiment. For easier viewing of the drawing in FIG. 1, the insulating portions other than the insulating film formed in the memory holes are not illustrated. Although silicon is used as the semiconductor in the examples of the embodiments hereinbelow, semiconductors other than silicon may be used.

For convenience of description in the specification, an XYZ orthogonal coordinate system will now be introduced. In this coordinate system, two mutually orthogonal directions parallel to a major surface of a substrate 10 are taken as an X direction and a Y direction; and a direction orthogonal to both the X direction and the Y direction is taken as a Z direction. Multiple conductive layers WL are stacked in the Z direction.

A back gate BG is provided above the substrate 10 via a not-illustrated insulating layer. The back gate BG is, for example, a conductive silicon layer to which an impurity is added. Multiple conductive layers WL are stacked alternately with not-illustrated insulating layers on the back gate BG. The conductive layer WL is, for example, a conductive silicon layer to which an impurity is added.

The conductive layers WL are divided into multiple blocks by slits aligned in the X direction. A drain-side select gate DSG is provided in one block above the conductive layer WL of the uppermost layer via a not-illustrated insulating layer. The drain-side select gate DSG is, for example, a conductive silicon layer to which an impurity is added. A source-side select gate SSG is provided in one other block adjacent to the one block above the conductive layer WL of the uppermost layer via a not-illustrated insulating layer. The source-side select gate SSG is, for example, a conductive silicon layer to which an impurity is added.

A source line SL is provided above the source-side select gate SSG via a not-illustrated insulating layer. The source line SL is, for example, a conductive silicon layer to which an impurity is added. Alternatively, a metal material may be used as the source line SL. Multiple bit lines BL are provided above the source line SL and the drain-side select gate DSG via a not-illustrated insulating layer. Each of the bit lines BL is aligned in the Y direction.

A memory hole MH having a U-shaped configuration is multiply made in the stacked body above the substrate 10. A hole is made in the block including the drain-side select gate DSG to pierce the drain-side select gate DSG and the conductive layers WL therebelow and align in the Z direction. A hole is made in the block including the source-side select gate SSG to pierce the source-side select gate SSG and the conductive layers WL therebelow and align in the Z direction. These two holes communicate with each other via a hole made in the back gate BG to align in the Y direction.

A channel body 20 is provided as a silicon layer having a U-shaped configuration in the interior of the memory hole MH. A gate insulating film 35 is formed on the inner wall of the memory hole MH between the drain-side select gate DSG and the channel body 20. A gate insulating film 36 is formed on the inner wall of the memory hole MH between the source-side select gate SSG and the channel body 20.

An insulating film 30 is formed on the inner wall of the memory hole MH between the channel body 20 and each of the conductive layers WL. The insulating film 30 is formed also on the inner wall of the memory hole MH between the channel body 20 and the back gate BG. The insulating film 30 has, for example, an oxide-nitride-oxide (ONO) structure in which a silicon nitride film is interposed between a pair of silicon oxide films.

Figure 2:
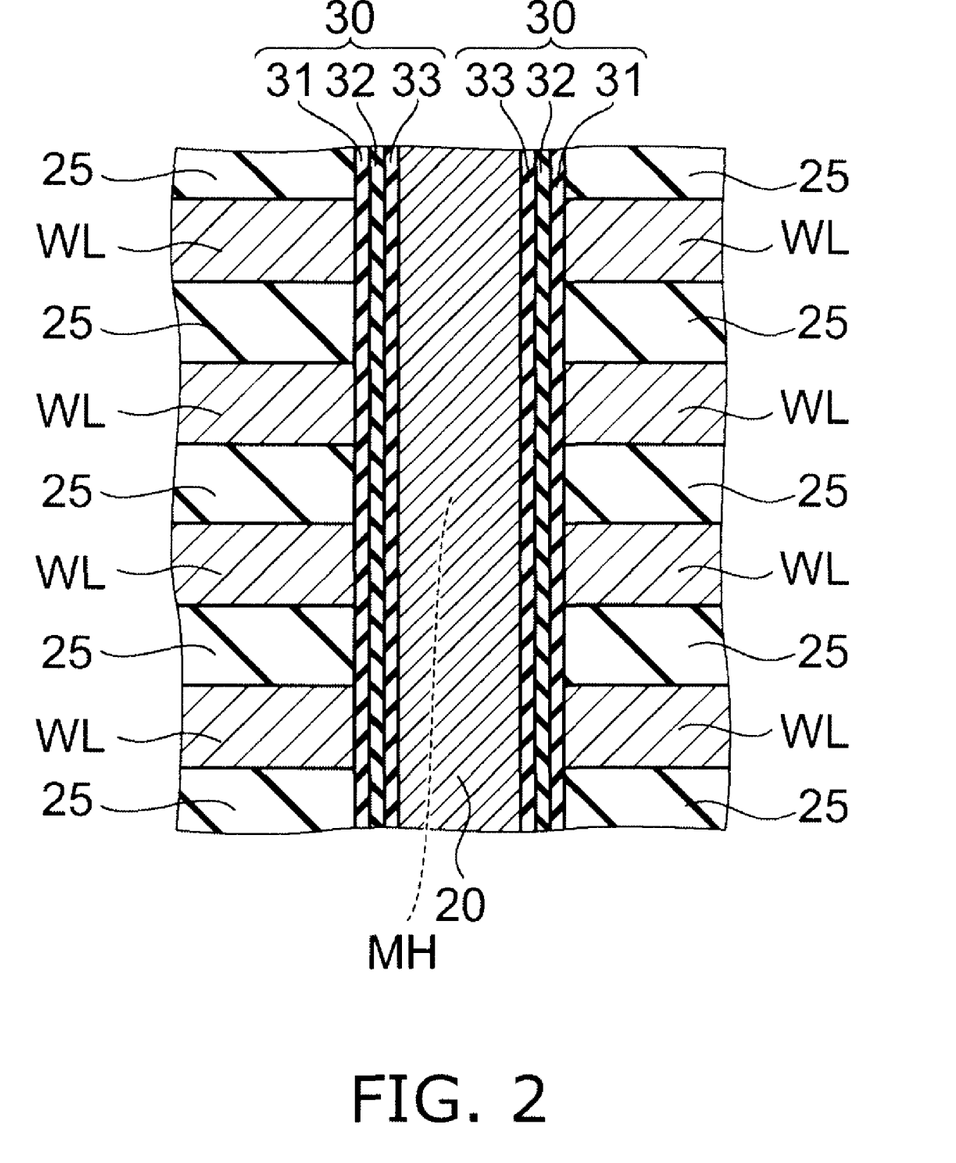
FIG. 2 is an enlarged cross-sectional view of a portion of FIG. 1.

FIG. 2 illustrates an enlarged cross section of a portion in which the channel body 20 pierces the multiple conductive layers WL and multiple inter-layer insulating layers 25. The insulating layers between the conductive layers WL not illustrated in FIG. 1 are illustrated in FIG. 2 as the insulating layers 25.

A first insulating film 31, a charge storage film 32, and a second insulating film 33 are provided in order from the conductive layer WL side between the channel body 20 and each of the conductive layers WL. The first insulating film 31 contacts the conductive layers WL; the second insulating film 33 contacts the channel body 20; and the charge storage film 32 is provided between the first insulating film 31 and the second insulating film 33.

The channel body 20 functions as a channel; the conductive layer WL functions as a control gate; and the charge storage film 32 functions as a data memory layer to store charge injected from the channel body 20. A memory cell having a structure in which a control gate encloses the periphery of a channel is formed at the intersection between the channel body 20 and each of the conductive layers WL.

The semiconductor device according to this embodiment is a nonvolatile semiconductor memory device in which the erasing/writing of data can be freely performed electrically and the memory content can be maintained even when the power source is switched OFF. For example, the memory cell has a charge trap structure. The charge storage film 32 is, for example, a silicon nitride film having many traps that trap charge (electrons). The second insulating film 33 is, for example, a silicon oxide film that forms a potential barrier when charge is injected from the channel body 20 into the charge storage film 32 or when the charge stored in the charge storage film 32 is diffused into the channel body 20. The first insulating film 31 is, for example, a silicon oxide film that prevents the charge stored in the charge storage film 32 from diffusing into the conductive layer WL.

Turning now once again to FIG. 1, a drain-side select transistor DST is formed of the drain-side select gate DSG, the channel body 20 piercing the drain-side select gate DSG, and the gate insulating film 35 provided between the channel body 20 and the drain-side select gate DSG. The upper end portion of the channel body 20 protruding upward from the drain-side select gate DSG is connected to the corresponding bit line BL.

A source-side select transistor SST is formed of the source-side select gate SSG, the channel body 20 piercing the source-side select gate SSG, and the gate insulating film 36 provided between the channel body 20 and the source-side select gate SSG. The upper end portion of the channel body 20 protruding upward from the source-side select gate SSG is connected to the source line SL.

A back gate transistor BGT is formed of the back gate BG, the channel body 20 provided in the back gate BG, and the insulating film 30 between the channel body 20 and the back gate BG.

A memory cell MC having the conductive layer WL as a control gate is multiply provided corresponding to the number of layers of the conductive layers WL between the drain-side select transistor DST and the back gate transistor BGT.

Similarly, the memory cell MC having the conductive layer WL as the control gate is multiply provided also corresponding to the number of layers of the conductive layers WL between the back gate transistor BGT and the source-side select transistor SST.

Such memory cells MC, the drain-side select transistor DST, the back gate transistor BGT, and the source-side select transistor SST are connected in series to form one memory string having a U-shaped configuration. By multiply arranging such a memory string in the X direction and the Y direction, multiple memory cells MC are provided three-dimensionally in the X direction, the Y direction, and the Z direction.

A method for manufacturing the semiconductor device according to this embodiment will now be described with reference to FIGS. 3A to 4B.

Figure 3A:
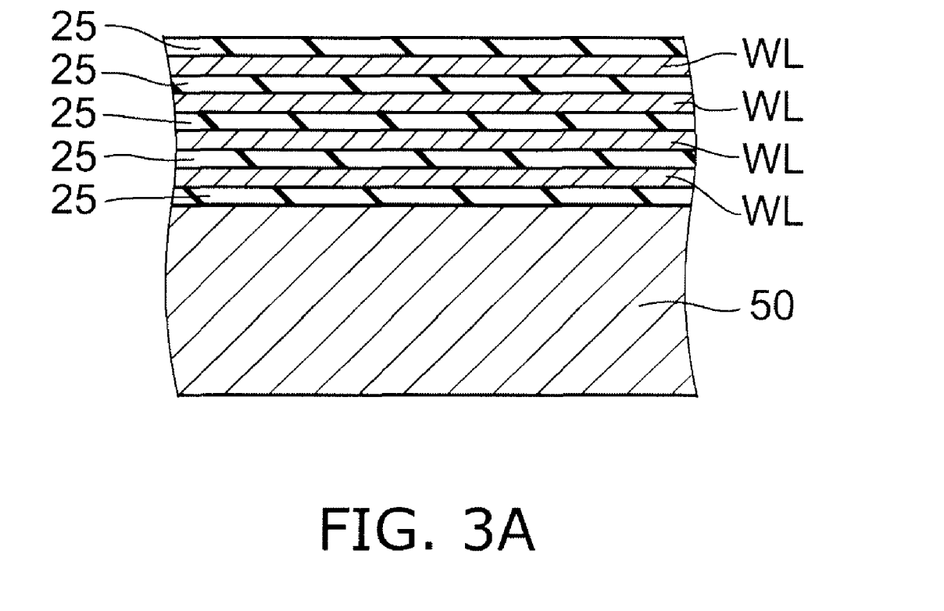

As illustrated in FIG. 3A, the insulating layer 25 and the conductive layer WL are multiply stacked alternately above a base member 50. Although four layers of the conductive layers WL are illustrated in the drawings, the number of layers of the conductive layers WL is arbitrary.

The base member 50 includes the substrate 10 and the back gate BG of FIG. 1. Prior to forming the stacked body of the insulating layers 25 and the conductive layers WL, the recess corresponding to the bottom portion of the memory string having the U-shaped configuration is made in the back gate BG. Then, after filling a sacrificial film into the recess, the insulating layers 25 and the conductive layers WL are stacked.

The insulating layer 25 is a silicon oxide layer including mainly silicon oxide; and the conductive layer WL is a silicon layer (e.g., a polycrystalline silicon layer) including mainly silicon. The insulating layer 25 and the conductive layer WL may be formed by, for example, chemical vapor deposition (CVD).

Figure 3B:
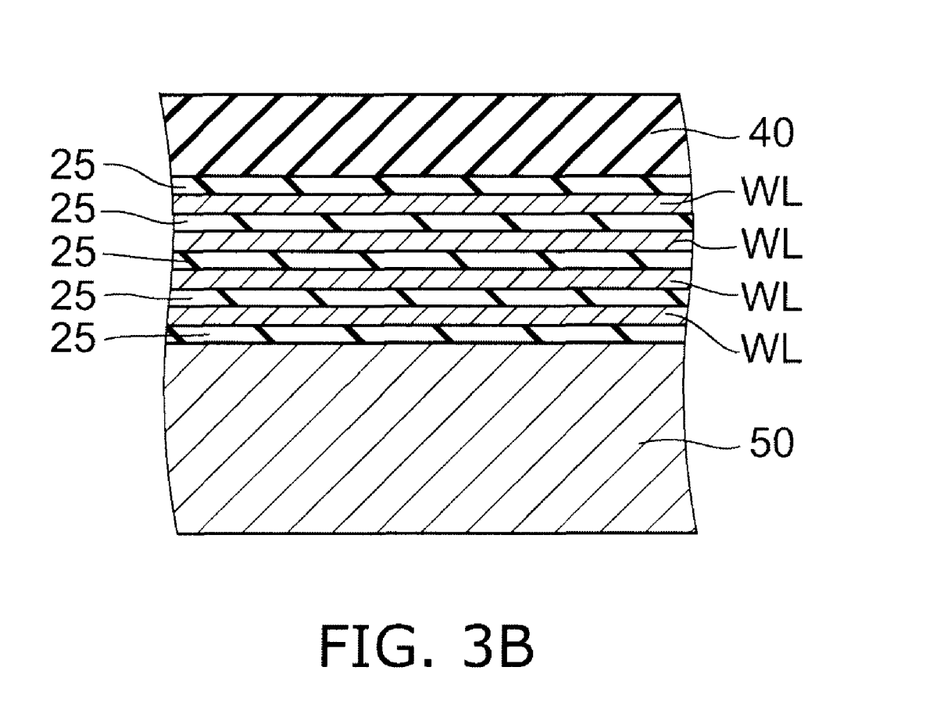

After forming the stacked body of the insulating layers 25 and the conductive layers WL, a SiOC film 40 is formed on the stacked body as illustrated in FIG. 3B. The uppermost layer of the stacked body recited above is, for example, the insulating layer 25; and the SiOC film 40 may be formed on the insulating layer 25 of the uppermost layer.

The SiOC film 40 may be formed, for example, by plasma CVD using a gas including silicon (Si), a gas including oxygen (O), and a gas including carbon (C). The SiOC film 40 contains silicon (Si), oxygen (O), and carbon (C) and further contains a slight amount of hydrogen (H) due to the source-material gas during the CVD. The composition ratio of each element of the SiOC film 40 is controllable by controlling conditions such as the introduced amount of each gas into the chamber during the CVD; and the composition ratio of each of the elements may be set arbitrarily according to the desired characteristics.

To form the SiOC film 40, it is also conceivable to form a silicon oxide film and subsequently introduce carbon into the silicon oxide film. However, in such a case, there is a risk that the carbon may have a distribution biased toward the surface side of the SiOC film 40; and the silicon oxide film on the side of the interface with the stacked body may undesirably remain as-is.

To obtain a SiOC structure including silicon, oxygen, and carbon over the entire thickness direction, it is desirable to form the SiOC film by introducing source-material gases including each of the elements together into the chamber and then producing plasma.

Figure 4A:
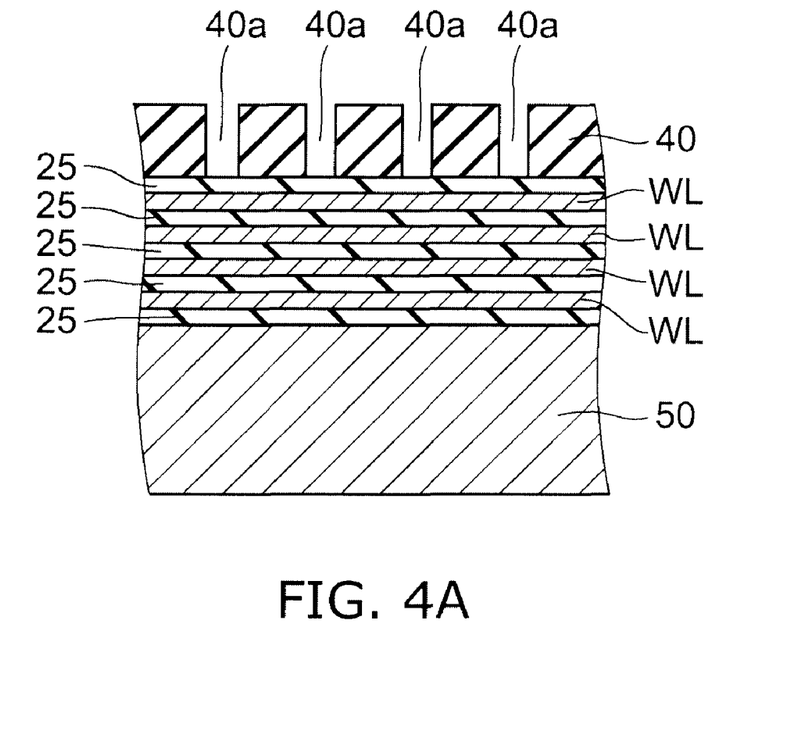

After forming the SiOC film 40, the SiOC film 40 is patterned by forming a not-illustrated mask layer including a resist and the like on the SiOC film 40 and performing, for example, reactive ion etching (RIE) using the mask layer. Thereby, multiple holes 40a are made in the SiOC film 40 as illustrated in FIG. 4A.

Figure 4B:
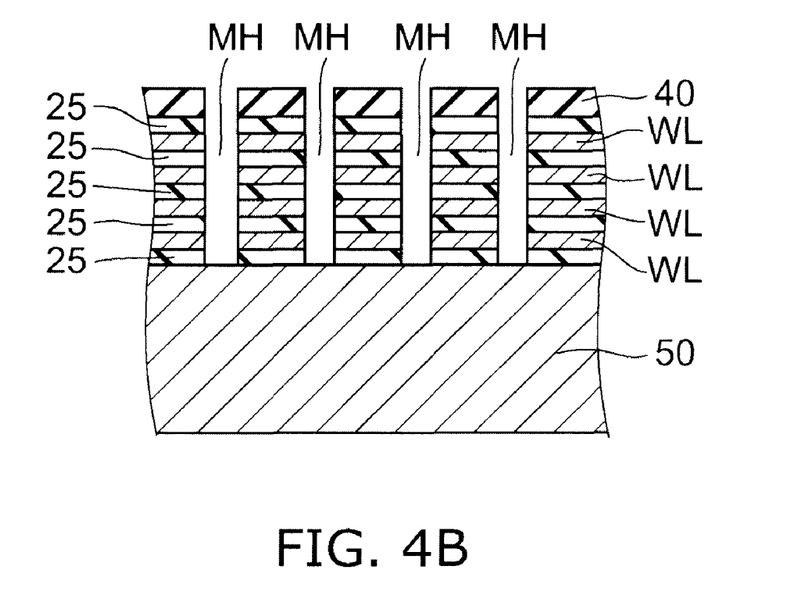

Then, using the patterned SiOC film 40 as a mask, the insulating layers 25 and the conductive layers WL exposed at the bottom portions of the holes 40a of the SiOC film 40 are etched alternately. Thereby, the memory holes MH are made to pierce the multiple insulating layers 25 and the multiple conductive layers WL as illustrated in FIG. 4B.

Specifically, a wafer on which the stacked body and the SiOC film 40 described above are formed is held in a chamber by a wafer holder. Then, in a state in which the desired gases and the desired reduced-pressure atmosphere are provided inside the chamber, the gases inside the chamber are excited to produce plasma.

First, for example, $C_4F_8$ gas, $O_2$ gas, and Ar gas are introduced into the chamber; and the insulating layer 25 of the uppermost layer is etched. At this time, a film including carbon (C) and fluorine (F) is thinly deposited on the insulating layer 25 surface; argon (Ar) ions impact the film; the oxygen (O) and the silicon (Si) included in the insulating layer 25, which is silicon oxide, bond with the carbon (C) and the fluorine (F), respectively; and the etching of the insulating layer 25 progresses.

When the insulating layer 25 is etched and removed, the conductive layer WL therebelow is exposed at the bottom portions of the holes 40a of the SiOC film 40. Then, the etching of the conductive layer WL can be performed continuously with the wafer placed as-is in the same chamber by changing the conditions such as the gas types introduced and the power exciting the gases.

For example, the conductive layer WL is etched by introducing HBr gas, $O_2$ gas, $CF_4$ gas, and $N_2$ gas into the chamber. HBr gas accounts for the greater part of the gases introduced into the chamber; and the chemical effect due to the bromine (Br) is dominant during the etching of the conductive layer WL. In other words, the effect of the silicon (Si) included in the conductive layer WL, which is a silicon layer, bonding to the bromine (Br) and being removed is dominant; and the etching progresses.

Further, the fluorine (F) and the carbon (C) included in the $CF_4$ gas deposit on the side walls of the holes 40a of the SiOC film 40 or on the side walls of the memory holes MH already made partway to suppress the increase of the hole diameters of the holes 40a and the memory holes MH due to excessive etching. As a result, the hole diameters of the memory holes MH can be substantially uniform in the depth direction; and characteristic fluctuation between memory cells of different levels can be suppressed.

Thus, by repeatedly etching the insulating layers 25 and the conductive layers WL, the memory holes MH punched through the stacked body above the base member 50 are made as illustrated in FIG. 4B. The series of processes to repeatedly etch the insulating layers 25 and the conductive layers WL can be performed continuously in the same chamber by switching the conditions such as the gas types introduced and the power that plasmatizes the gases. Accordingly, it is unnecessary to move the wafer between chambers during the series of processes recited above; and efficient processing can be performed.

In the case of a comparative example in which a silicon oxide film is used as the mask to etch the stacked body recited above, the consumed amount of the silicon oxide film etching mask, which is the same silicon oxide as the insulating layer 25, is undesirably about the same as that of the insulating layer 25 during the etching of the insulating layer 25; and the etching resistance is low. Accordingly, particularly in the case where the number of stacks of the conductive layers WL and the insulating layers 25 is increased, it is necessary to increase the thickness of the etching mask; and the productivity decreases. In the case where the thickness of the etching mask is increased, the aspect ratios (the ratio of the depth to the hole diameter) of the holes made therein increase; and it is difficult to pattern holes having the desired sizes and configurations.

Conversely, in this embodiment, the SiOC film 40 having etching selectivity with respect to the conditions for etching the insulating layers 25 and the conditions for etching the conductive layers WL is used as the etching mask. Thereby, the amount of the mask consumed during the etching of the multiple insulating layers 25 and the multiple conductive layers WL can be reduced. For example, in the case where the same stacked body is etched with the same conditions, it is possible for the thickness of the SiOC film mask to be not more than half the thickness of the silicon oxide film mask.

Moreover, the silicon oxide film etching mask has a low resistance to radicals produced during the etching; and the hole diameters of holes in such an etching mask easily increase. Such an increase may cause the side walls of the conductive layers WL facing the memory holes MH to be patterned in a tapered configuration which may cause fluctuation of the device characteristics between different layers.

The SiOC film 40 has a higher radical resistance during the etching than that of the silicon oxide film; and the increase of the hole diameters of the holes 40a can be suppressed. As a result, a memory hole MH having a side wall substantially perpendicular to the major surface of the base member 50 can be formed; and the fluctuation of the device characteristics between different layers can be suppressed.

In the case of another comparative example in which a carbon film which is a material different from both the silicon oxide layer and the silicon layer is formed as the etching mask on the stacked body recited above by, for example, CVD, an etching selectivity relatively higher than that of the silicon oxide layer can be ensured; and the increase of the hole diameters also can be suppressed. However, in the case where the carbon film is used as the etching mask, the carbon (C) of the mask material is deposited inside the holes during the etching of the silicon layers; and a decrease of the etching rate occurs easily.

Conversely, using the SiOC film 40 as the etching mask reduces the amount consumed during the etching of the insulating layers 25 and the conductive layers WL and provides a higher etching rate than the case where the carbon film is used.

For example, a comparison was performed using an etching mask of the SiOC film 40 containing 3 atomic percent of carbon (C) and an etching mask of the carbon film to etch the same stacked body including the insulating layers 25 and the conductive layers WL with the same conditions.

As a result, during the etching of the insulating layer 25, the consumed amount (the consumed film thickness) of the SiOC film 40 was about 30 percent of the consumed amount of the carbon film. During the etching of the conductive layer WL, the consumed amount (the consumed film thickness) of the SiOC film 40 was about 60 percent of the consumed amount of the carbon film.

$C_5F_8$ gas, $C_4F_6$ gas, $CHF_3$ gas, etc., may be used instead of the $C_4F_8$ gas described above as the gas including carbon (C) and fluorine (F) used to etch the insulating layer 25. In particular, $C_4F_8$ gas, $C_5F_8$ gas, and $C_4F_6$ gas which have relatively high proportions of carbon (C) promote the bonding reaction with the oxygen (O) included in the insulating layer 25; and the etching rate of the insulating layer 25 can be increased.

Instead of the HBr gas described above as the gas used to etch the conductive layer WL, $Cl_2$ gas, which is a halogen element like Br, may be used. In such a case as well, the etching of the conductive layer WL progresses mainly by the effect of the bonding reaction of chlorine (Cl) with the Si of the conductive layer WL. Further, according to knowledge obtained by the inventors, gas including Br etches the conductive layer WL at a higher rate than when gas including Cl is used.

The conductive layer WL and the insulating layer 25 may be etched with the same gas condition using etching gas mixed a gas including halogen (for example, fluorine, bromine, chlorine and others), and the gas including carbon and fluorine.

After the memory holes MH are made in the stacked body described above, the SiOC film 40 remaining on the stacked body (on the insulating layer 25 of the uppermost layer) is removed. To remove the SiOC film 40, a removal method having selectivity with respect to the insulating layer 25 therebelow may be applied.

Figure 5A:
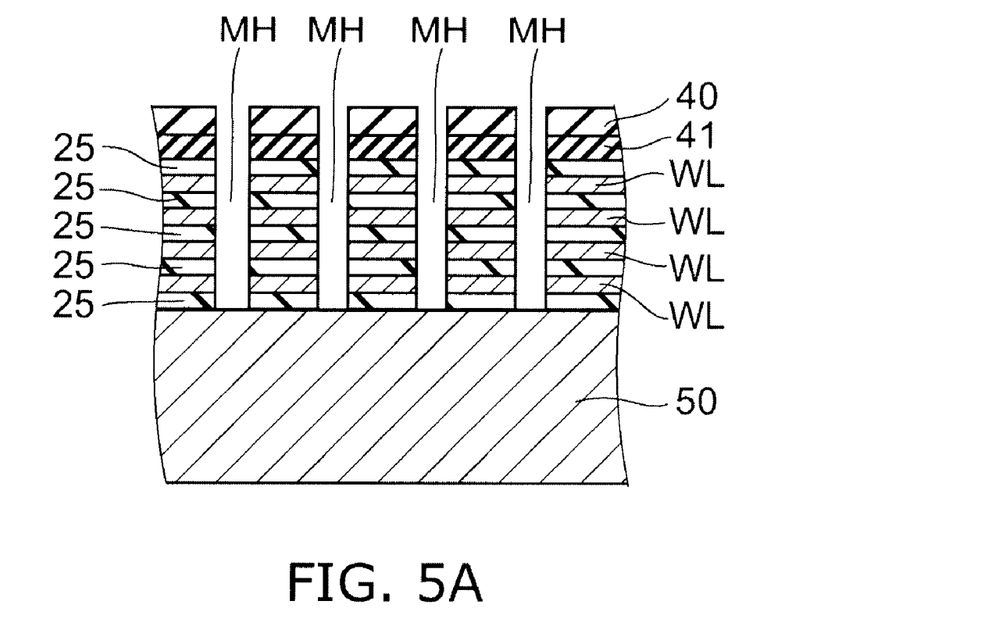
FIGS. 5A and 5B are schematic cross-sectional views illustrating a method for manufacturing a semiconductor device according to another embodiment.

For example, as illustrated in FIG. 5A, methods may include forming a stopper film 41 between the stacked body (the insulating layer 25 of the uppermost layer) and the SiOC film 40 where the stopper film 41 is a material different from the materials of the stacked body and the SiOC film 40. After forming, for example, a SiN film as the stopper film 41 on the insulating layer 25, i.e., the uppermost layer of the stacked body, the SiOC film 40 is formed on the stopper film 41.

Figure 5B:
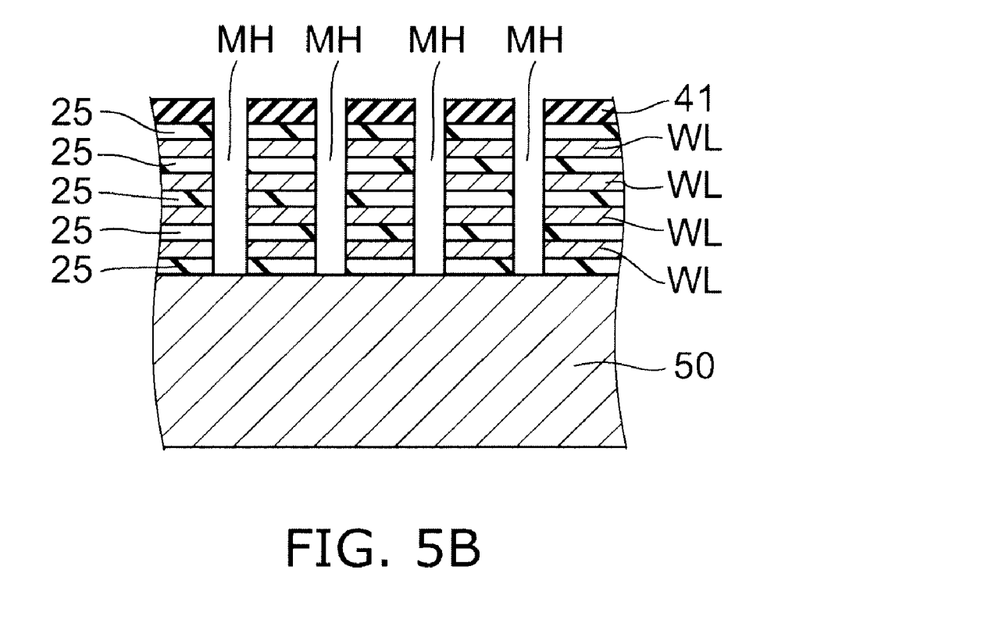

Then, after making the memory holes MH, the SiOC film 40 is removed from the entire surface by performing, for example, etch-back (FIG. 5B). Subsequently, the stopper film 41 remaining on the stacked body can be removed using, for example, hot phosphoric acid to ensure selectivity with respect to the insulating layer 25.

Alternatively, instead of providing the stopper film 41, the SiOC film 40 can be removed by ensuring selectivity with respect to the insulating layer 25 by using dilute hydrogen fluoride (dHF) having a concentration adjusted to not more than 0.01 weight percent. Or, the SiOC film 40 can be removed by ensuring selectivity with respect to the insulating layer 25 by vapor phase cleaning (VPC) with hydrogen fluoride (HF).

The memory holes MH are made on the sacrificial film in the recesses made in the back gate BG; and the bottom portions of the memory holes MH reach the sacrificial film. Then, after removing the SiOC film 40, a sacrificial film is filled also into the memory holes MH. Then, an upper layer stacked body including a select gate layer (a conductive layer) and an insulating layer are stacked on the stacked body, where the select gate layer forms the drain-side select gate DSG or the source-side select gate SSG illustrated in FIG. 1.

Then, after making holes punched through the select gate layer by, for example, RIE, the sacrificial film in the memory holes MH and the sacrificial film in the recesses therebelow are removed via the holes punched through the select gate layer. By removing these sacrificial films, one pair of the memory holes MH punched through the stacked body communicates with the recess made in the back gate BG; and a memory hole having a U-shaped configuration can be obtained.

Subsequently, the insulating film 30 including the charge storage film 32 is formed on the inner wall of the memory hole. Subsequently, the channel body 20 is filled onto the inner side of the insulating film 30 in the memory hole.

The configuration of the memory string is not limited to the U-shaped configuration. An I-shaped configuration in which the multiple conductive layers WL are aligned in a straight line configuration in the stacking direction may be used. The insulating film structure between the conductive layers WL and the channel body 20 is not limited to the oxide-nitride-oxide (ONO) structure. For example, a two-layer structure of a charge storage layer and a gate insulating film may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A method for manufacturing a semiconductor device, comprising:
    multiply stacking an insulating layer and a conductive layer alternately above a base member, the insulating layer including silicon oxide, the conductive layer including silicon;
    forming a SiOC film on a stacked body of the insulating layers and the conductive layers;
    patterning the SiOC film; and
    making a hole in the stacked body by etching the multiple insulating layers and the multiple conductive layers alternately using the patterned SiOC film as a mask.

2. The method according to claim 1, wherein the SiOC film is formed by plasma chemical vapor deposition (CVD) using a gas including silicon, a gas including oxygen, and a gas including carbon.

3. The method according to claim 1, wherein the conductive layer is etched using a gas including Br.

4. The method according to claim 3, wherein the conductive layer is etched using a gas including F in addition to the gas including Br.

5. The method according to claim 1, wherein the conductive layer is etched using a gas including Cl.

6. The method according to claim 1, wherein the insulating layer is etched using a gas including carbon and fluorine.

7. The method according to claim 6, wherein the insulating layer is etched using a gas including one selected from $C_4F_8$, $C_5F_8$, and $C_4F_6$.

8. The method according to claim 6, wherein the insulating layer is etched using argon gas in addition to the gas including carbon and fluorine.

9. The method according to claim 6, wherein the conductive layer and the insulating layer are collectively etched using a gas including halogen in addition to the gas including carbon and fluorine.

10. The method according to claim 1, further comprising removing the SiOC film after the making of the hole.

11. The method according to claim 10, further comprising forming a stopper film on the stacked body prior to the forming of the SiOC film, a material of the stopper film being different from a material of an uppermost layer of the stacked body and a material of the SiOC film.

12. The method according to claim 11, wherein a silicon nitride film is formed as the stopper film.

13. The method according to claim 10, wherein the SiOC film is removed using dilute hydrogen fluoride.

14. The method according to claim 10, wherein the SiOC film is removed by vapor phase cleaning (VPC) with hydrogen fluoride.

15. The method according to claim 1, further comprising
    forming an insulating film including a charge storage film on an inner wall of the hole, and
    forming a semiconductor layer in the hole on an inner side of the insulating film.

16. The method according to claim 15 further comprising, prior to the forming of the stacked body:
    forming a back gate;
    making a recess in the back gate; and
    filling a sacrificial film into the recess, the stacked body being stacked on the back gate after filling the sacrificial film into the recess, the hole being made to reach the sacrificial film, the recess and a pair of the holes punched through the stacked body communicating with each other to make a hole having a U-shaped configuration by removing the sacrificial film via the holes.

17. The method according to claim 15, wherein the forming of the insulating film includes:

forming a first silicon oxide film on an inner wall of the hole;

forming a silicon nitride film as the charge storage film on an inner side of the first silicon oxide film; and forming a second silicon oxide film on an inner side of the silicon nitride film.

* * * * *